United States Patent [19]

Asami

[11] Patent Number: 4,698,529
[45] Date of Patent: Oct. 6, 1987

[54] OUTPUT CONTROL CIRCUIT TO PREVENT OUTPUT OF INITIAL SPIKE NOISE

[75] Inventor: Fumitaka Asami, Kunitachi, Japan

[73] Assignee: Fujitsu Limited, Kanagawa, Japan

[21] Appl. No.: 736,029

[22] Filed: May 20, 1985

[30] Foreign Application Priority Data

May 30, 1984 [JP] Japan .................... 59-108529

[51] Int. Cl.$^4$ .................... H03B 1/04; H03K 5/00; H03K 5/13
[52] U.S. Cl. .................... 307/542; 307/550; 307/568; 307/200 B; 307/594; 307/592
[58] Field of Search ........... 307/542, 548, 550, 568, 307/200 A, 200 B, 279, 443, 571, 572, 573, 592, 597, 594, 303, 601, 307, 296 R; 361/58, 91

[56] References Cited

U.S. PATENT DOCUMENTS

| 3,774,053 | 11/1973 | Carlson .................... 307/558 |
| 3,975,649 | 8/1976 | Kawagoe et al. .................... 307/448 |
| 4,019,070 | 4/1977 | Sakaguchi et al. .................... 307/279 |
| 4,044,270 | 8/1977 | Lesser .................... 307/481 |
| 4,345,172 | 8/1982 | Kobayashi et al. .................... 307/473 |

FOREIGN PATENT DOCUMENTS

| 0076925 | 5/1982 | Japan .................... 307/594 |
| 0224921 | 12/1984 | Japan .................... 307/594 |

OTHER PUBLICATIONS

IBM Technical Disclosure Bulletin, vol. 20, No. 6, Nov., 1977, pp. 2370-2371, New York, U.S.; C. R. Hoffman, "Anti-Glitch Circuit".

Primary Examiner—Stanley D. Miller
Assistant Examiner—Timothy P. Callahan
Attorney, Agent, or Firm—Armstrong, Nikaido, Marmelstein & Kubovcik

[57] ABSTRACT

Initial spike noise which occurs, when an IC is switched on, is suppressed by an output control circuit provided between the output terminal of an inner logic circuit and an output circuit of the IC. The output control circuit clamps the input terminal of the output control circuit until the supply voltage builds up to a steady state. The output control circuit comprises two stages each connected between the supply voltage and ground. The first stage has a series connection of a first FET and first resistor, the second stage has a series connection of a second FET, third FET and second resistor. The first FET is controlled by a reset signal and turns off the second FET until the reset signal is released. The second FET turns off the third FET which transmits the output signal of the inner circuit to the output circuit of the IC. When the reset signal is released, the third FET and hence the output circuit begins operation.

9 Claims, 4 Drawing Figures

OUTPUT CONTROL CIRCUIT TO PREVENT OUTPUT OF INITIAL SPIKE NOISE

BACKGROUND OF THE INVENTION

This invention is related to an output circuit for an IC (integrated circuit) whose output is prevented from generating a spike noise at a starting time when the source voltage is building up in the IC.

In many of the output circuits of IC devices especially in output circuits of CMOS (complementary metal oxide semiconductor) devices a click noise or spike noise is generated at the start of operation, namely when the voltage source is switched on and the device begins to operate. Usually such initial spike noise is very small and harmless since the source of voltage has not sufficiently built up and it is low compared to the operating voltage of the ICs, hence the spike is very small. However, a problem can occur if the circuit or device which receives the output of the IC comprises a sensitive circuit such as flip-flop circuit or latch circuit which is already in an operating condition to be driven by small pulse.

The spike noise is generated in the inner logic circuit of the IC, at the start of operation. One reason for generation of such spike noise is considered to be due to the interaction between the build-up phenomena of the source voltage $V_{cc}$ and the threshold voltages $V_{th}$ for various transistors, especially in enhancement type transistors forming the logic circuit of the IC. Namely, when the voltage supply source is switched on and the gate voltage is increased over the threshold voltage $V_{th}$, the transistor drain current begins to flow, but since the threshold voltage of each transistor is different, drain current flow is random. Thus, at the start of the IC operation, there is an instant when the logic circuit operates in a disorderly fashion, and an excess pulse is generated. The probability of generating such initial spike noise is increased as the IC increases in complexity.

In order to avoid malfunction in following stages of the system caused by the initial spike noise of the IC, a reset circuit has been provided between the IC and the following stage of the system, and the system was kept waiting until the foregoing stage IC began its normal operation. However, such a technique requires a long time until the entire system is ready for normal operation. Moreover, it requires rather complicated reset circuits at many points in the system.

SUMMARY OF THE INVENTION

It is the primary object of the present invention, to provide an IC device in which the initial spike noise is suppressed.

Another object of the present invention is to provide an output control circuit for an IC device which prevents the output of the initial spike noise from the IC device.

The foregoing objects are obtained by inserting a control circuit between the inner circuit and the output circuit of the IC. The control circuit clamps the input voltage of the output circuit to a low level and keeps the output circuit in a reset state until the inner circuit is ready for normal operation.

The output control circuit comprises two stages each connected between the voltage source and ground. The first stage has a series connected first resistive element and a first transistor which receives a reset signal and controls the second stage which has a series connection of a second transistor, a third transistor and a second resistive element. The input signal (that is the output signal of the inner logic circuit) is applied to the third transistor which transmits the signal to the output circuit. By the operation of the second transistor which is controlled by the first transistor, the output circuit is clamped to a reset state until the reset signal is released.

The resistive elements should be a pure resistance however, it can be a resistor or a normally on type transistor which acts as a resistance in the control circuit.

These together with objects and advantages of the present invention will become apparent from the detailed description of preferred embodiments with reference to the drawings.

BRIEF DESCRIPTION OF THE DRAWINGS

FIG. 2 shows a circuit diagram of one embodiment of the output control circuit of the present invention, wherein:

FIG. 2(a) shows an example when the control circuit is applied to an open drain type output buffer circuit; and FIG. 2(b) shows an example when the control circuit is applied to a push-pull type output buffer circuit.

DETAILED DESCRIPTION OF PREFERRED EMBODIMENTS

Figure 1:
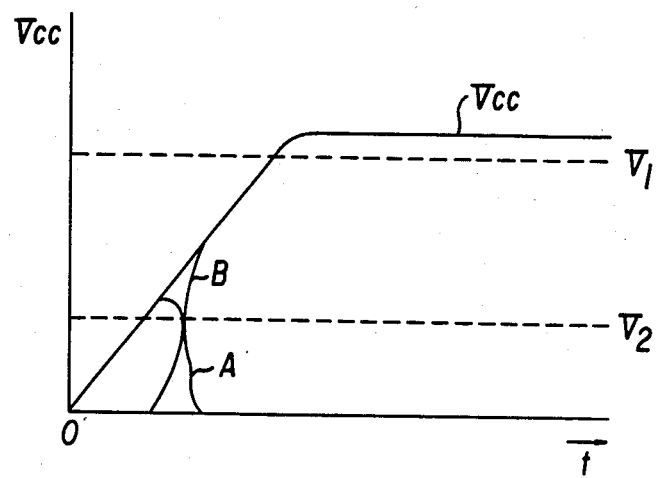
FIG. 1 is a graph illustrating how the initial spike noise is generated in an IC.

First, how the initial spike noise is generated in IC will be briefly described. FIG. 1 is a graph showing a transient situation of voltage build-up in an FET (field effect transistor) when the supply voltage $V_{cc}$ is switched on. The abscissa is the time t from the instant of turn on. The ordinate is the voltage $V_{cc}$ appearing on the voltage supply line, or source voltage of the FET operated by the voltage $V_{cc}$.

As can be seen, the source voltage builds up from the instant of turn on (t=0) as shown by the curve $V_{cc}$ and reaches a predetermined voltage, for example, 5 volts. A broken line $V_1$ indicates a voltage for which the normal operation of the circuit is guaranteed, for example, 4.5 volts, and a broken line $V_2$ indicates the lowest voltage at which the circuit begins to operate, for example, 1.5 volts. These voltages depend on the circuit design and circuit elements used in the circuit. The time during which the transient phenomena occurs is 2 ms for instance, but of course it depends on the circuit.

Curve A in FIG. 1 shows the behavior of an enhancement type FET whose initial state should be a low state L (or ON state). Considering an n-channel FET, in order to keep its output voltage at an L level, the gate voltage should be at a high level H. But if the FET is not operated properly, and the gate voltage is insufficient, the output voltage will increase as the $V_{cc}$ goes up. And when $V_{cc}$ reaches the lowest voltage $V_2$ at which the circuit works properly, the FET is switched ON and the output voltage will go down as shown by the curve A. As can be seen in the figure, the FET generates the initial spike noise.

Curve B in FIG. 1 shows the behavior of an FET whose initial state should be at an H level (or OFF state). Considering in this case a p-channel FET, in order to keep its output voltage at an H level, the gate voltage should be at an H level, therefore, in a similar manner to the above case, the output voltage will go up after a period of time, as shown by the curve B. If such current is differentiated, it will provide a pulse.

As has been described above, as the logic circuit becomes more complicated, the chance of generating an initial spike pulse is increased. The present invention is intended to suppress such spike noise by an output control circuit in the IC. It should be pointed out that it is important to make the output control circuit operate perfectly even in the transient condition when the supply voltage is beginning to build-up.

Figure 2:
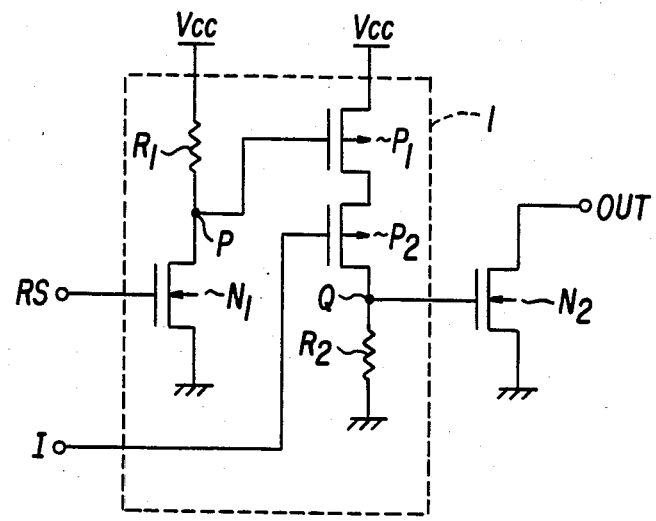
Figure 2:
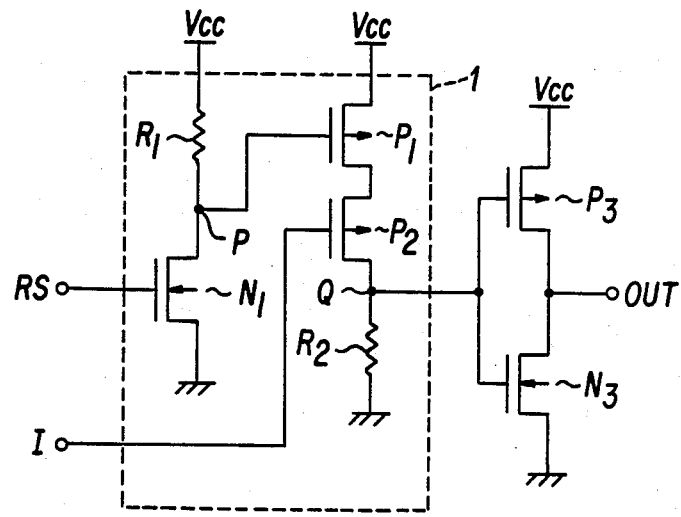

FIGS. 2(a) and 2(b) show circuit diagrams of a first embodiment of the present invention in which, FIG. 2(a) is an example using the circuit for an open drain type output buffer circuit, and FIG. 2(b) is an example using the circuit for a push-pull type output buffer circuit. In the figures the output control circuit of the invention is enclosed by a broken line 1. The circuit comprises two stages. The first stage comprises a resistor $R_1$ and an n-channel first FET $N_1$ connected in series between a first voltage source line that is a positive side of voltage supply source $V_{cc}$, and a second voltage source that is a negative side of the voltage supply source, in this case the latter is a ground line (GND). The second stage comprises a p-channel second FET $P_1$, a p-channel third FET $P_2$ and second resistor $R_2$, which are connected in series between the first and the second voltage supply line ($V_{cc}$ and ground).

In FIG. 2(a), the gate of the first FET $N_1$ is connected to a terminal RS which receives a reset signal. A circuit point P which is the connection point of the drain of the first FET $N_1$ and one end of the first resistor $R_1$ is connected to gate of the second FET $P_1$. An input signal I is applied to the gate of the third FET $P_2$. The input signal I is the output signal of the inner logic circuit of the IC (not shown). The drain of the second FET $P_1$ and source of the third FET $P_2$ are connected to each other, and a circuit point Q which is the connection point of the drain of the third FET $P_2$ and one end of the second resistor $R_2$ is connected to the gate of an n-channel output gate transistor $N_2$. The source of the output transistor $N_2$ is connected to the second source line (ground), and the drain is connected to an output terminal OUT. Thus, the output circuit is an open drain circuit.

Operation of the circuit in FIG. 2(a) is characterized in that when the IC is switched on and the source voltage is applied, a reset signal is applied to the reset terminal RS and the output gate is clamped in a reset condition until the supply voltage builds up to a steady state. When the source voltage builds up, the reset signal is released and the output gate is operated normally.

The operation of the circuit of FIG. 2(a) is as follows. At the starting time of the circuit, that is at the time the supply voltage for the IC is switched on, a reset signal of a low level (L) is applied to the reset terminal RS. The reset signal may be applied in advance of the supply voltage being switched on. The reset signal turns off the n-channel first FET $N_1$, so that the circuit point P is charged up to the source voltage $V_{cc}$ through the first resistor $R_1$. The gate of the p-channel second FET $P_1$ then becomes at a high level (H). It should be pointed out that the high level (H) in this case is not identical to that of the logic circuit when the $V_{cc}$ is in normal state. Since in this case $V_{cc}$ is still in the rising state, the $V_{cc}$ voltage is lower than in the normal or steady state condition. Nevertheless, the gate voltage appearing at the gate of the FET $P_1$ is at high level for each instant during voltage build-up. Accordingly, the second FET $P_1$ is also turned off.

Under such a condition, regardless of whether a H or L level is applied to the input terminal I, current does not flow through the second resistor $R_2$, since the second FET $P_1$ is off. Therefore, the gate of the output transistor $N_2$ is clamped to ground potential through the second resistor $R_2$, and the initial spike noise is suppressed. The reference character I will be used to designate either the input signal or input terminal hereinafter.

When the source voltage reaches the steady state voltage, the reset terminal RS is switched to an H level, the first FET $N_1$ turns ON, and the circuit point P and hence the gate of the second FET $P_1$ become L level, so the second FET $P_1$ becomes conductive (ON state). Under this condition, the third FET $P_2$ is supplied with the voltage $V_{cc}$ through the first FET $P_1$ and it begins its switching action. Namely, according to the H and L level of the input signal at the input terminal I, the circuit point Q varies to L or H, and the output transistor $N_2$ is driven.

In order to secure the above operation even in the transient condition of the supply voltage build up, it is necessary that the circuit elements $R_1$ and $R_2$ be purely resistive though their value of resistance are not so critical. If not the circuit points P and Q will not follow the variation of $V_{cc}$ in time, and if there is a phase or time difference between them the circuit does not work well.

In the above embodiment and the disclosure of the invention hereinafter, the explanation with respect to the circuit elements $R_1$ and $R_2$ will treat $R_1$ and $R_2$ as resistors. But it will be clear for one skilled in the art that the circuit elements $R_1$ and $R_2$ are not restricted to resistors, they may be a normally on type FET for example. In fact, from the view point of manufacturing the circuit, it is favorable to replace the resistors with FETs, because they can be fabricated in the same process as other FETs included in the IC, and there is no need to add a process for fabricating resistors. It should be pointed out that, the FETs used as the resistive element should be a normally on type. If they are constructed as conventional FETs it will not work well until the source voltage reaches to the lowest operating voltage ($V_2$).

The value of resistances $R_1$ and $R_2$ is not critical, and they may be between a few K ohms to hundreds of K ohms. However, if the resistance becomes too small, the current through the resistor becomes large and the circuit loss increases, and if the resistance becomes too high, the time constant of the circuit becomes large and the operation cannot follow the voltage build up of the $V_{cc}$. When the resistance is replaced by a normally on type FET, it is well known that the effective inner resistance of the FET is determined by the width and length of the channel, so the size of the FET may be designed by the one skilled in the art. Usually it is unnecessary to design a special pattern for the FET, because in ordinary ICs there are many FET patterns used for the inner logic circuit, so a proper one may be used for the resistive element.

FIG. 2(b) shows an embodiment of the invention which is applied for a push-pull type output circuit. The output control circuit encircled with a broken line 1 is identical to that of FIG. 2(a). In this case the circuit point Q is connected to the common connected gates of a push-pull type output transistors $P_3$ (p-channel) and $N_3$ (n-channel). In a similar manner as described above, the gate of the output circuit is clamped to ground potential until the reset signal, applied to the terminal RS, is released (changed from L to H).

In the above explanation the reset signal applied to the reset terminal is held at a low level L until the circuit voltage builds up properly. The reset signal is applied from an outer circuit to the IC, and there may be a case when the level of the reset signal is reversed, namely the reset signal is H during the starting time, and it varies to L. An embodiment of the circuit applicable for such case is shown in FIG. 3.

Figure 3:
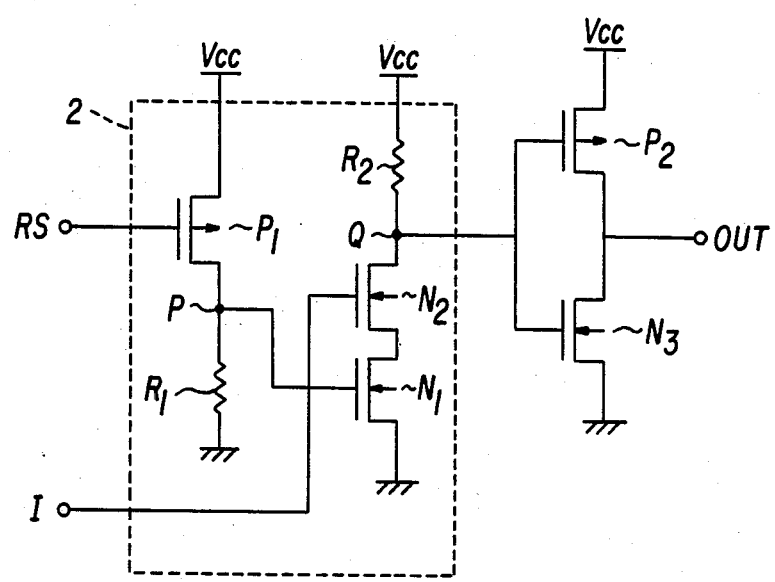
FIG. 3 is another embodiment of the output control circuit of the present invention which is applied to a push-pull type output buffer circuit.

In FIG. 3, the output control circuit of the present invention is shown encircled with a broken line 2. The figure shows a case in which the circuit is used with a push-pull type output buffer circuit, wherein like reference symbols or numerals refer to like or similar elements in FIG. 2(b). The circuit comprises two stages. The first stage comprises a p-channel first FET $P_1$ and a first resistive element $R_1$ which are connected in series between the first voltage supply line ($V_{cc}$) and the second voltage supply line (in this case it is ground). The second stage comprises a second resistive element $R_2$, third n-channel FET $N_2$ and a second n-channel FET $N_1$ connected in series between the first voltage supply line and the second voltage supply line.

The gate of the FET $P_1$ is connected to the reset signal terminal RS, and the drain of FET $P_1$ is connected one end of $R_1$ at point P which is also connected to the gate of the FET $N_1$. The drain of FET $N_1$ and source of FET $N_2$ are connected to each other, and input terminal I which is the output terminal of an inner logic circuit (not shown) is connected to the gate of the FET $N_2$. The junction point Q which connects one end of the resistor $R_2$ and drain of FET $N_2$ is connected to the commonly connected gates of output transistors $P_2$ (p-channel) and $N_3$ (n-channel).

Operation of the circuit of FIG. 3 is similar to that of FIG. 2(b) except for the reset signal. In the circuit of FIG. 3, a reset signal of an H level is applied to the reset terminal RS at the starting time of the IC. The reset signal may be applied prior to the start. Then the first FET $P_1$ is cut off and the channel point P is grounded through the first resistive element $R_1$. The second FET $N_1$ is thus cut off and the circuit point Q is charged up through the resistor $R_2$ and becomes H. The gates of the output transistors $P_2$ and $N_3$ are therefore clamped to an H level in spite of the H or L level of the input signal. The output is thus kept to an L level until the reset signal is released. When the voltage of the supply line reaches the steady state, the reset signal is changed from H to L, then FET $P_1$ is turned off and the circuit point P becomes L, so the FET $N_1$ becomes conductive. Thus the input signal is transferred to the circuit point Q by the FET $N_2$, and the IC begins to operate.

In FIG. 3, an embodiment for use with a push-pull type output circuit is shown. But it will be easy for the one skilled in the art to apply it to any other type of output circuit. Other modifications are also possible. For example, the input of the output circuit may be clamped to ground potential or to the source voltage, etc. Such modifications are all in the scope of the invention.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalency of the claims are, therefore, to be embraced therein.

I claim:

1. An output control circuit for an IC device for clamping an input terminal of an output circuit of said IC to prevent the output of an initial noise spike appearing at the starting time when a supply voltage is building up in the IC device, said output control circuit comprising:

an input terminal for receiving an input signal;
an output terminal for providing an output;
first and second voltage supply lines for providing said supply voltage;
a first resistive element having a first end connnected to said first voltage supply line and a second end connected to a first junction point;
a first transistor, connected between said first junction point and said second voltage supply line, said transistor having a gate for receiving a reset signal, said first transistor further being turned off in response to said reset signal;
second and third transistors connected in series between said first voltage supply line and a second junction point operatively connected to said output terminal, said second transistor having a gate connected to said first junction point such that said second transistor is turned off when the reset signal is applied to the gate of said first transistor, said third transistor having a gate connected to said input terminal for receiving the input signal; and
a second resistive element connected between said second junction point and said second voltage supply line.

2. An output control circuit for an IC device according to claim 1, wherein:

said first transistor is a first n-channel FET having a source connected to said second voltage supply line, a drain connected to said first junction point;
said second transistor is a first p-channel FET having a source connected to the first voltage supply line, a gate connected to said first junction point, and a drain;
said third transistor is a second p-channel FET having a source connected to the drain of said first p-channel FET, and a drain connected to said second junction point.

3. An output control circuit for an IC device according to claim 1, wherein:

said second voltage supply line supplies a higher voltage than said first voltage supply line;
said first transistor is a first p-channel FET having a source connected to said second voltage supply line, and a drain connected to said first junction point;
said second transistor is a first n-channel FET having a source connected to said first voltage supply line, and a drain;
said third transistor is a second n-channel FET having the source connected to the drain of said first n-channel FET, and a drain connected to said second junction point.

4. An output control circuit for an IC device according to claim 1, wherein:

a resistance of said first and second resistive elements is in a range from few hundreds ohms to few hundreds of kilo ohms.

5. An output control circuit for an IC device according to claim 4, wherein:
at least one of said first and second resistive element is a resistor having a resistance in a range from few hundreds ohms to few hundreds of kilo ohms.

6. An output control circuit for an IC device according to claim 4, wherein:
at least one of said first and second resistive elements is normally on type FET having an effective inner resistance is in a range from few hundreds ohms to few hundreds of kilo ohms.

7. An output control circuit for an IC device according to claim 2, wherein:
the reset signal is at a low level while the supply voltage is rising, and it changes to a high level when the supply voltage reaches a predetermined voltage level.

8. An output control circuit for an IC device according to claim 3, wherein:
the reset signal is at a high level while the supply voltage is rising, and changes to low level when the supply voltage reaches a specified voltage.

9. An output control circuit for an IC device according to any one of claims 1, 2 or 3 wherein:
the first voltage supply line is the positive side of the voltage source of the IC; and
the second voltage supply line is the negative side of the voltage source of the IC.

* * * * *